(12) United States Patent
Hashimoto et al.

(10) Patent No.: US 7,142,377 B2
(45) Date of Patent: Nov. 28, 2006

(54) LENS-ATTACHED LIGHT-EMITTING ELEMENT

(75) Inventors: Takahiro Hashimoto, Minato-ku (JP);
Hideshi Nagata, Minato-ku (JP);
Kenjiro Hamanaka, Minato-ku (JP)

(73) Assignee: Nippon Sheet Glass Company, Limited, Tokyo (JP)

( * ) Notice: Subject to any disclaimer, the term of this patent is extended or adjusted under 35 U.S.C. 154(b) by 0 days.

(21) Appl. No.: 11/180,217

(22) Filed: Jul. 13, 2005

(65) Prior Publication Data

US 2006/0012888 A1    Jan. 19, 2006

(30) Foreign Application Priority Data

Jul. 13, 2004   (JP) .............................. 2004-205508

(51) Int. Cl.
*G02B 3/06*   (2006.01)
(52) U.S. Cl. ...................... 359/797; 359/710; 359/796; 257/98
(58) Field of Classification Search ................ 359/710, 359/796–797; 257/98
See application file for complete search history.

(56) References Cited

U.S. PATENT DOCUMENTS 3,844,639 A * 10/1974 Smith .......................... 359/668
4,703,219 A * 10/1987 Mesquida .................... 313/111
5,526,190 A *  6/1996 Hubble et al. ............... 359/719
5,633,527 A *  5/1997 Lear ............................ 257/432
6,188,527 B1    2/2001 Bohn

FOREIGN PATENT DOCUMENTS

| JP | 9-109455 | 4/1997 |
| JP | 2000-347317 | 12/2000 |
| JP | 2001-36144 | 2/2001 |
| WO | WO 2005/001944 | 1/2005 |

* cited by examiner

Primary Examiner—Jordan M. Schwartz
(74) Attorney, Agent, or Firm—RatnerPrestia

(57) ABSTRACT

A lens-attached light-emitting element for increasing an optical availability efficiency is provided. A lens-attached light-emitting element for structuring a light-emitting element array arranged in one dimension comprises a light-emitting element having an approximately U-shaped light-emitting area; and an approximately U-shaped composite lens including a combination of two cylindrical lenses arranged in a direction of the one dimension, one cylindrical lens, and four hemispherical lenses. Where the width in a direction of the one dimension of the light-emitting area is p, the thickness of the base portion of the composite lens is in the range of 0–0.71 p, a radius of curvature of each of the cylindrical lens and hemispherical lens is in the range of 0.20 p–0.47 p, and a center-to-center distance between at least two cylindrical lenses is in the range of 0.35 p–0.89 p.

6 Claims, 3 Drawing Sheets

LENS-ATTACHED LIGHT-EMITTING ELEMENT

BACKGROUND OF THE INVENTION

1. Field of the Invention

The present invention relates to a lens-attached light-emitting element, particularly to a lens-attached light-emitting element having an improved optical availability efficiency.

2. Related Art

An optical system of a writing head in an optical printer is usually designed so that an image of light spot of respective LED (Light-Emitting Diode) constructing an LED array is focused on a photosensitive drum through a lens array. As a lens array, a distributed index rod lens array is often used.

A typical construction of an LED array, a distributed index rod lens array, and a photosensitive drum used in a conventional optical printer is shown in FIG. 1. In the figure, the LED is designated by reference numeral 10, the rod lens array by reference numeral 12, and the photosensitive drum by reference numeral 14.

An effective aperture angle of the lens array 12 is in the range of 17°–20° as a half angle, whereas the LED 10 emits light principally in Lambertian distribution, so that an optical availability efficiency is extremely low. The only 3–5% of the light emitted in a Lambertian distribution from the LED is transmitted to the photo-sensitive dram 14 through the lens array 12. This means that only the 95–97% of the light emitted by the LED is not utilized, resulting in a problem of a low optical availability efficiency.

In order to increase the optical availability efficiency, it is conceivable that a micro lens array is provided directly on the light-emitting area of the LED to cause the directivity of the light ray from the LED narrower so as to increase the light ray impinging into an aperture angle of the lens array. In general, the center part of the light-emitting area of the LED array used for an optical printer is covered by an electrode 20 extended into the light-emitting area 22, so that the shape of an effective light-emitting area is approximately U-shaped as shown in FIG. 2. In order to cause the directivity of the light ray from the light-emitting area 22 narrower by means of a conventional micro lens array 18 as shown in FIG. 3, it is preferable that the light ray designated by a dotted line 23 neighbored to an optical axis of the lens is utilized. However, the area neighbored to the optical axis corresponds to the position of the electrode 20, resulting in the problem such that the optical availability efficiency may not be fully increased.

An LED array provided with a micro lens array has been disclosed in Japanese Patent Publication Nos. 9-109455, 2000-347317, and 2001-36144. However, these publications have not discussed such a problem and the shape of a micro lens.

It is noted that the above-described problem is applied not only to an LED but also another light-emitting element.

SUMMARY OF THE INVENTION

An object of the present invention is to provide a lens shape for increasing an optical availability efficiency.

Another object of the present invention is to provide a lens-attached light-emitting element for increasing an optical availability efficiency.

A first aspect of the present invention is a lens-attached light-emitting element for structuring a light-emitting element array arranged in one dimension, comprising: a light-emitting element having an approximately U-shaped light-emitting area; and an approximately U-shaped composite lens including a combination of at least two cylindrical lenses arranged side by side in a direction of the one dimension and a plurality of partial spherical lenses, the composite lens being composed of a base portion having a fixed thickness and curved surface portions each upper surface thereof being curved in a predetermined curvature; wherein when the width in a direction of the one dimension of the light-emitting area is p, the thickness of the base portion of the composite lens is in the range of 0–0.71 p, a radius of curvature of each of the cylindrical lens and partial spherical lens is in the range of 0.20 p–0.47 p, and a center-to-center distance between the at least two cylindrical lenses is in the range of 0.35 p–0.89 p.

A second aspect of the present invention is a lens-attached light-emitting element for structuring a light-emitting element array arranged in one dimension, comprising: a light-emitting element having an approximately U-shaped light-emitting area; and a composite lens including a combination of two partial spherical lenses arranged side by side in a direction of the one dimension and one partial spherical lens, the composite lens being composed of a base portion having a fixed thickness and curved surface portions each upper surface thereof being curved in a predetermined radius of curvature; wherein when the width in a direction of the one dimension of the light-emitting area is p, the thickness of the base portion of the composite lens is in the range of 0–0.71 p, a radius of curvature of the partial spherical lens is in the range of 0.71 p–1.18 p, and a center-to-center distance between the two partial spherical lenses is in the range of 0.23 p–1.64 p.

A third aspect of the present invention is a lens-attached light-emitting element for structuring a light-emitting element array arranged in one dimension, comprising: a light-emitting element having an approximately U-shaped light-emitting area; and an approximately U-shaped composite lens including a combination of two partial spherical lenses arranged side by side in a direction of the one dimension and partial spherical lenses, the composite lens being composed of a base portion having a fixed thickness and curved surface portions each upper surface thereof being curved in a predetermined radius of curvature; wherein when the width in a direction of the one dimension of the light-emitting area is p, the thickness of the base portion of the composite lens is in the range of 0–0.71 p, a radius of curvature of the partial spherical lens is in the range of 0.47 p–1.18 p, and a center-to-center distance between the two partial spherical lenses is in the range of 0.23 p–1.17 p.

It is noted that the partial spherical lens herein means a part of a complete spherical lens.

BEST MODE FOR CARRYING OUT THE INVENTION

An embodiment of the present invention will now be described. In one example of a lens-attached LED in accordance with the present invention, a composite lens is provided on a approximately U-shaped light-emitting area 22 of an LED shown in FIG. 4. The shape of the light-emitting area 22 is standardized in such a manner that the approximately U-shaped form is basic and the length thereof in an X-axis direction is p. The X-axis direction is a direction that the light-emitting areas are arranged for an array, i.e., a direction that the light spots of the light-emitting areas are scanned. The centers of an electrode 20 and the light-emitting area 22 are both positioned on a line parallel to a Y-axis. It is noted that the X-axis and Y-axis show the axes of an X-Y coordinate system.

The length in the Y-axis direction of the light-emitting area 22 is 1.06 p, and the width of the electrode 20 is 0.35 p. These values are used as an example in one model of the embodiment, therefore they are not restrictive.

The shape of a composite lens to be provided on the approximately U-shaped light-emitting area 22 described above will now explained. It is assumed that the composite lens is made of resin.

Figure 5A:
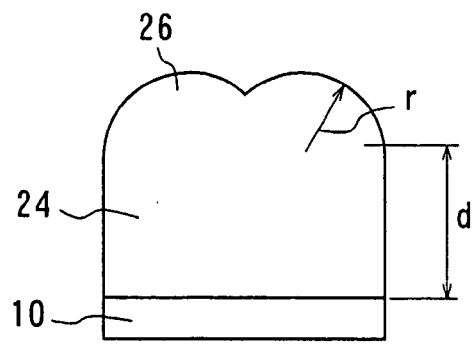
FIGS. 5A and 5B show the cross-sectional view of a composite lens.
Figure 5B:
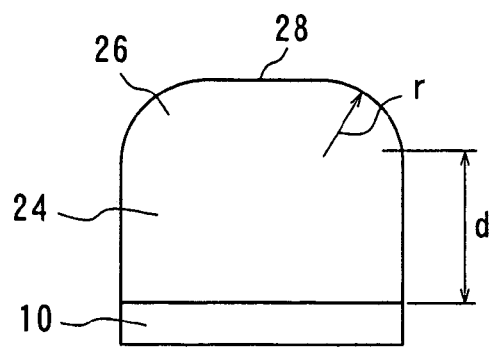

According to the basic shape of a composite lens in accordance with the present invention, the composite lens comprises a base portion 24 having a fixed thickness from the surface of a light-emitting area (i.e., a light-emitting surface), and a curved surface portions 26 having a hemispherical shape or cylindrical shape on the base portion 24 as shown in FIGS. 5A and 5B. FIG. 5A shows a composite lens having two curved surface portions 26, and FIG. 5B a composite lens having a curved surface portion 26 and flat portion 28, respectively.

A radius of curvature of the curved surface portion 26 is referred to as "a radius of curvature r." In the case that the composite lens includes the flat portion as shown in FIG. 5B, the radius of curvature r designates that of the curved surface portion other than the flat portion. The thickness from the light-emitting surface to the start point of the curved surface is referred to as "a base thickness d."

The shape of the composite lens will be described.

(a) Approximately U-shaped Composite Lens

Figure 6:
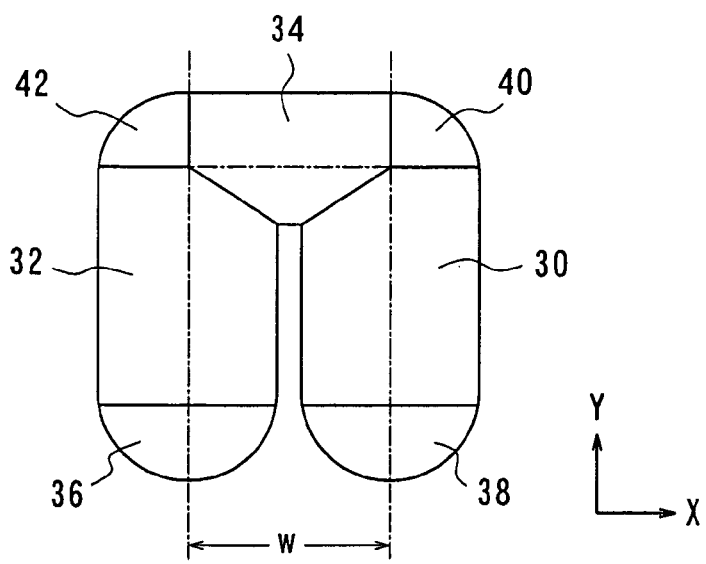
FIG. 6 shows a plan view of an example of a composite lens.

As shown in FIG. 6, the composite lens comprises a combination of cylindrical lenses 30, 32, 34 and hemispherical lenses 36, 38, 40, 42 corresponding to the approximately U-shaped light-emitting area of an LED. The upper portion of each cylindrical lens has a semi-cylindrical shape, and the hemispherical lens is composed of a part of a complete hemispherical lens. Each of the hemispherical lenses 36 and 38 is composed of a half of a complete hemispherical lens, and each of the hemispherical lenses 40 and 42 is composed of one fourth of a complete hemispherical lens. A center-to-center distance w of a pair of cylindrical lenses 30 and 32 arranged in parallel in an X-axis direction as shown in the figure is an important parameter in addition to the parameter d in a thickness direction as shown in FIGS. 5A and 5B.

(b) Three-lens Composite Type

Figure 7:
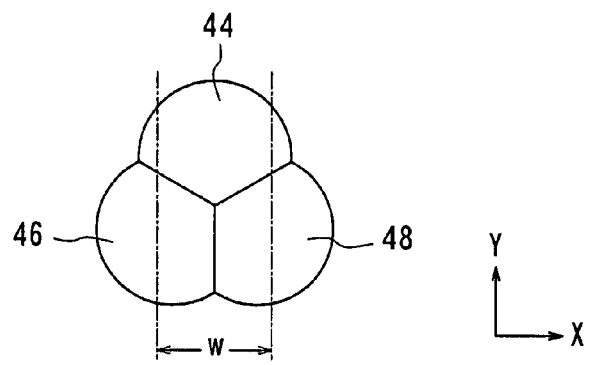
FIG. 7 shows a plan view of a plan view of another example of a composite lens.

As shown in FIG. 7, three hemispherical lenses (correctly speaking, a part of a complete hemispherical lens) 44, 46 and 48 are arranged corresponding to the approximately U-shaped light-emitting area of an LED to form a composite lens in such a manner that a center-to-center distance w of two hemispherical lenses is shorter than the diameter of the hemispherical lens. The shape of each hemispherical lens is fan-shaped. That is, two hemispherical lenses 46 and 48 arranged side by side in an X-axis direction, and one hemispherical lens 44 is positioned adjacent to the two hemispherical lenses. A center-to-center distance w of the two lenses 46 and 48 in an X-axis direction corresponding to the left-right direction of the U-shaped light-emitting area is an important parameter.

(c) Two-lens Composite Type

Figure 8:
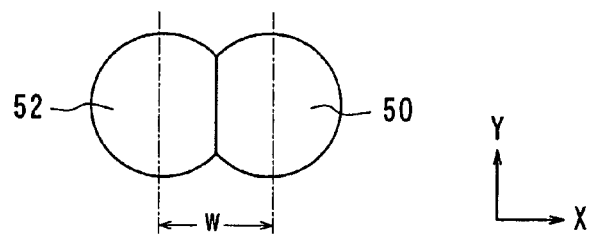
FIG. 8 shows a plan view of a further example of a composite lens.

As shown in FIG. 8, two hemispherical lenses (correctly speaking, a part of a complete hemispherical lens) 50 and 52 are simply arranged in an X-direction corresponding to the approximately U-shaped light-emitting area of an LED in such a manner that a center-to-center distance of the two hemispherical lenses is shorter than the diameter w of the hemispherical lens. A center-to-center distance w of the two lenses 50 and 52 in an X-axis direction corresponding to the left-right direction of the U-shaped light-emitting area is an important parameter.

The optimization of lens shape will be described. The radius of curvature r and base thickness d were caused to be varied in two dimensions as shown in the following Tables with respect to the shape of a light-emitting area (p=17 μm was selected as an example of actual dimension) in FIG. 4, and then an increased range (more than 1.1 times) of the amount of light was determined in comparison with a light-emitting element having no lens. The optimal values of a lens shape in which the amount of light is maximum were determined.

The center-to-center distance w of two lenses was determined as an range within which all of the light-emitting area is covered by a composite lens, because the decrease of the amount of light was caused when there was a region having no lens on the light-emitting-area.

On the other hand, the pitch between the light-emitting areas in an LED array is not smaller than the length p in an X-axis direction of the light-emitting area. If the composite lens described above is utilized, the interference between adjacent lenses is not caused, and the variation of the pitch between the light-emitting areas has no effect on the increase of the amount of light. In this embodiment, the pitch between the light-emitting areas is 1.25 p.

First, the approximately U-shaped composite lens shown in FIG. 6 will be described.

TABLE 1

Approximately U-shaped composite lens

| | Varied range | Amount of light increased range | Optimal value |
|---|---|---|---|
| Radius of curvature r | 0.17 p–0.47 p | 0.20 p–0.47 p | 0.27 p |
| Base thickness d | 0–0.88 p | 0–071 p | 0.35 p |
| Center-to-center distance between lenses w | | 0.35 p–0.89 p | 0.70 p |
| Refractive index of resin | 1.46–1.68 | | |

The ratio of the amount of light obtained by varying the base thickness d and radius of curvature r in the range of Table 1 and the amount of light generated by the LED having no lens, i.e., the ratio of amount of light was determined. The determined results are shown in Table 2. The ratios of amount of light having 1.01 or more are shown in a gray zone in Table 2.

TABLE 2

Approximately U-shaped composite lens

| Base thickness d | | Radius of curvature r | | | | |
|---|---|---|---|---|---|---|
| μm | p reduced | p reduced μm | 0.176 3.0 | 0.206 3.5 | 0.235 4.0 | 0.265 4.5 | 0.471 8.0 |
| 0 | 0.000 | 0.3 | 1.2 | 1.3 | 1.5 | 1.5 |
| 1 | 0.059 | 0.7 | 1.4 | 1.4 | 1.7 | 1.7 |
| 2 | 0.118 | 0.9 | 1.5 | 1.5 | 1.9 | 1.8 |
| 4 | 0.235 | 1.0 | 1.6 | 1.7 | 2.0 | 1.9 |
| 6 | 0.353 | 1.2 | 1.7 | 2.0 | 2.1 | 2.0 |
| 8 | 0.471 | 1.0 | 1.6 | 1.9 | 2.0 | 1.9 |
| 10 | 0.588 | 0.5 | 1.5 | 1.7 | 1.7 | 1.4 |
| 12 | 0.706 | 0.1 | 1.2 | 1.6 | 1.5 | 1.3 |
| 15 | 0.882 | 0.1 | 0.8 | 0.9 | 0.9 | 0.9 |

The amount of light in the case of the composite lens having the lens shape of optimal conditions (radius of curvature and base thickness), the center-to-center distance of lenses of 0.70 p, and the refractive index of resin of 1.55 was 2.1 times that of the LED having no lens. Magnification of the composite lens was 1.2 or less in the range of increased amount of light.

Second, the three-lens type of composite lens shown in FIG. 7 will be described.

TABLE 3

Three-lens type of composite lens

| | Varied range | Amount of light increased range | Optimal value |
|---|---|---|---|
| Radius of curvature r | 0.24 p–1.18 p | 0.71 p–1.18 p | 0.94 p |
| Base thickness d | 0–0.88 p | 0–071 p | 0.12 p |
| Center-to-center distance between lenses w | | 023 p–1.64 p | 1.41 p |
| Refractive index of resin | 1.46–1.68 | | |

The ratio of amount of light obtained by varying the base thickness d and radius of curvature r in the range of Table 3 and the amount of light generated by the LED having no lens was determined. The determined results are shown in Table 4. The ratios of amount of light having 1.01 or more are shown in a gray zone in Table 4.

TABLE 4

Three-lens type of composite lens

| Base thickness d | | Radius of curvature r | | | | |
|---|---|---|---|---|---|---|
| μm | p reduced | p reduced μm | 0.235 4 | 0.471 8 | 0.706 12 | 0.941 16 | 1.176 20 |
| 0 | 0.00 | 0.75 | 0.90 | 1.05 | 1.05 | 1.05 |
| 2 | 0.12 | 0.80 | 0.70 | 1.05 | 1.10 | 1.05 |
| 4 | 0.24 | 0.75 | 0.80 | 0.70 | 0.70 | 1.70 |
| 6 | 0.35 | 0.60 | 0.80 | 0.60 | 0.70 | 1.70 |
| 8 | 0.47 | 0.40 | 0.50 | 0.50 | 0.60 | 0.60 |
| 10 | 0.59 | 0.40 | 0.40 | 0.40 | 0.50 | 0.50 |

The amount of light in the case of the composite lens having the lens shape of optimal conditions (radius of curvature and base thickness), the center-to-center distance of lenses of 1.41 p, and the refractive index of resin of 1.55 was 1.1 times that of the LED having no lens. Magnification of the composite lens was 1.2 or less in the range of increased amount of light.

Next, the two-lens type of composite lens shown in FIG. 8 will be described.

TABLE 5

Two-lens type of composite lens

| | Varied range | Amount of light increased range | Optimal value |
|---|---|---|---|
| Radius of curvature r | 0.24 p–1.18 p | 0.47 p–1.18 p | 0.94 p |
| Base thickness d | 0–0.88 p | 0–071 p | 0.59 p |
| Center-to-center distance between lenses w | 0.23 p–1.41 p | 0.23 p–1.17 p | 0.94 p |
| Refractive index of resin | 1.46~1.68 | | |

The amount of light obtained by varying the base thickness d and radius of curvature r in the range of Table 5 and the amount of light generated by the LED having no lens was determined. The determined results are shown in Table 6. The ratios of amount of light having 1.01 or more are shown in a gray zone in Table 6.

TABLE 6

Two-lens type of composite lens

| Base thickness d | | Radius of curvature r | | | | |
|---|---|---|---|---|---|---|
| μm | p reduced | p reduced μm | 0.24 4 | 0.47 8 | 0.71 12 | 0.94 16 | 1.18 20 |
| 0 | 0.00 | 0.7 | 1.5 | 1.6 | 1.7 | 1.6 |
| 2 | 0.12 | 0.8 | 1.6 | 1.7 | 1.9 | 1.9 |
| 4 | 0.24 | 0.7 | 1.9 | 1.8 | 2.0 | 1.8 |
| 6 | 0.35 | 0.6 | 2.0 | 1.9 | 1.9 | 1.7 |
| 8 | 0.47 | 0.4 | 1.9 | 1.8 | 1.9 | 1.8 |
| 10 | 0.59 | 0.4 | 1.7 | 1.7 | 1.8 | 1.8 |
| 12 | 0.71 | 0.1 | 1.2 | 1.6 | 1.5 | 1.3 |
| 15 | 0.88 | 0.1 | 0.7 | 0.9 | 0.9 | 0.9 |

The amount of light in the case of the composite lens having the lens shape of optimal conditions (radius of curvature and base thickness), the center-to-center distance of lenses of 0.94 p, and the refractive index of resin of 1.55 was 2.0 times that of the LED having no lens.

The range of increased amount of light described above was determined on the basis of a approximately U-shaped light-emitting area. When a light-emitting area is smaller than the above-described approximately U-shaped area, the brightness ratio in respective numerical ranges of lens shape parameter is 1.01 or more. Therefore, each numerical range is effective for the light-emitting area having a shape as shown in FIGS. 9A–9D, respectively.

Figure 1:
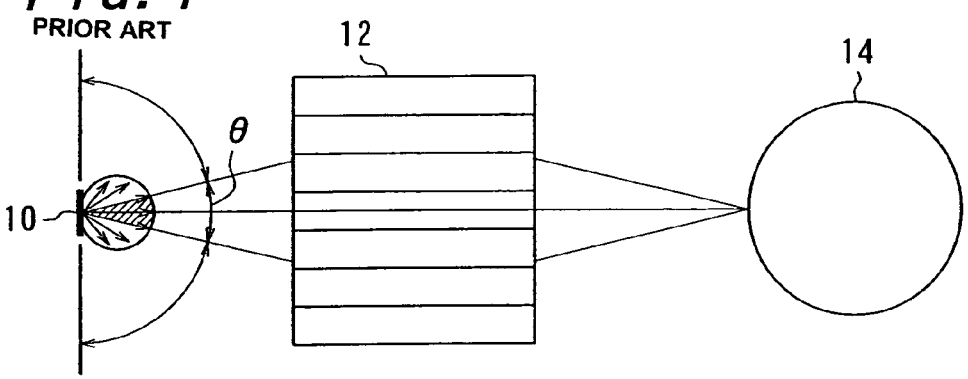
FIG. 1 shows a typical construction of an LED array, a distributed index rod lens array, and a photosensitive drum used in a conventional optical printer.
Figure 2:
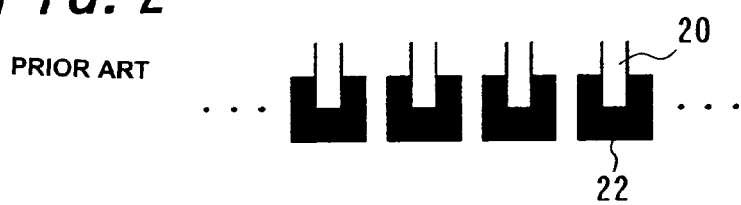
FIG. 2 shows a shape of a light-emitting area.
Figure 3:
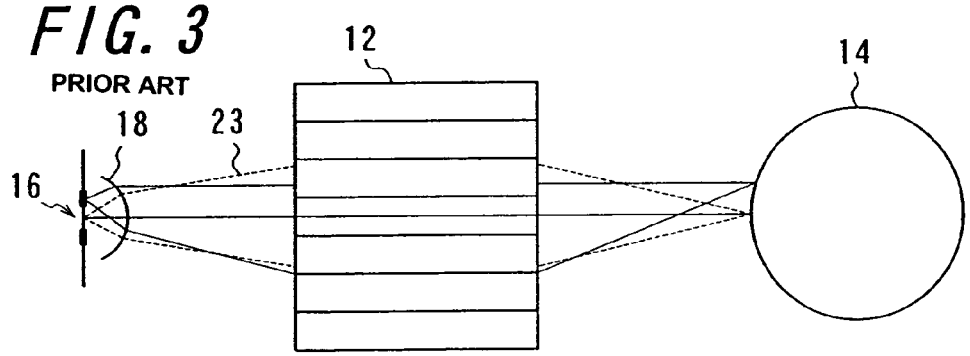
FIG. 3 shows a light ray to a photosensitive drum in the case that a conventional micro lens array is used.
Figure 4:
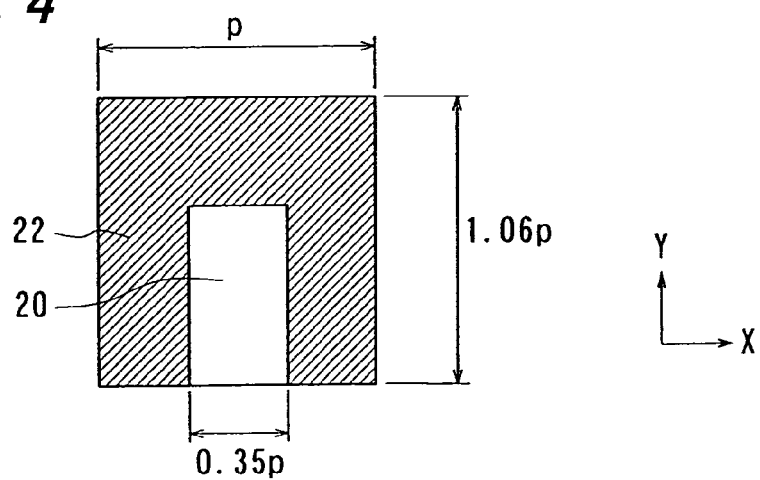
FIG. 4 shows the size of a light-emitting area.
Figures 9A, 9B, 9C, 9D:
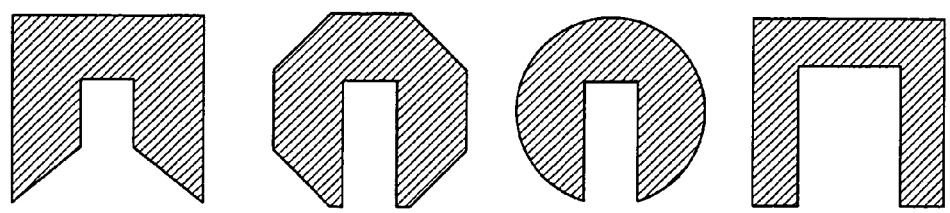
FIGS. 9A, 9B, 9C and 9D show various shapes of the light-emitting area.

FIG. 9A shows the shape in which the ends of a U-shaped light-emitting element shown in FIG. 4 are cut away obliquely. FIG. 9B shows the shape in which the corners of a U-shaped light-emitting element shown in FIG. 4 are cut away obliquely. FIG. 9D shows the shape in which the outline of a U-shaped light-emitting element shown in FIG. 4 are made circular. FIG. 9D shows the shape in which the width of a U-shaped light-emitting element shown in FIG. 4 is made narrower.

While the embodiments have been described on the basis of an LED as an example of a light-emitting element, it is clear for those who skilled in the art that the present invention is not limited to an LED, but is applicable to any type of light-emitting element, for example three-terminal light-emitting thyristor.

The invention claimed is:

1. A lens-attached light-emitting element for structuring a light-emitting element array arranged in one dimension, comprising:
   a light-emitting element having an approximately U-shaped light-emitting area; and
   an approximately U-shaped composite lens including a combination of at least two cylindrical lenses arranged side by side in a direction of the one dimension and a plurality of partial spherical lenses, the composite lens being composed of a base portion having a fixed thickness and curved surface portions each upper surface thereof being curved in a predetermined radius of curvature; wherein
   when the width in a direction of the one dimension of the light-emitting area is p,
   the thickness of the base portion of the composite lens is in the range of 0–0.71 p,
   a radius of curvature of each of the cylindrical lens and partial spherical lens is in the range of 0.20 p–0.47 p, and
   a center-to-center distance between the at least two cylindrical lenses is in the range of 0.35 p–0.89 p.

2. The lens-attached light-emitting element according to claim 1, wherein
   the thickness of the base portion of the composite lens is 0.35 p,
   a radius of curvature of each of the cylindrical lens and partial spherical lens is 0.27 p, and
   a center-to-center distance between the at least two cylindrical lenses is 0.70 p.

3. A lens-attached light-emitting element for structuring a light-emitting element array arranged in one dimension, comprising:
   a light-emitting element having an approximately U-shaped light-emitting area; and
   a composite lens including a combination of two partial spherical lenses arranged side by side in a direction of the one dimension and one partial spherical lens, the composite lens being composed of a base portion having a fixed thickness and curved surface portions each upper surface thereof being curved in a predetermined radius of curvature; wherein
   when the width in a direction of the one dimension of the light-emitting area is p,
   the thickness of the base portion of the composite lens is in the range of 0–0.71 p,
   a radius of curvature of each of the partial spherical lenses is in the range of 0.71 p–1.18 p, and
   a center-to-center distance between the two side by side partial spherical lenses is in the range of 0.23 p–1.64 p.

4. The lens-attached light-emitting element according to claim 3, wherein
   the thickness of the base portion of the composite lens is 0.12 p,
   a radius of curvature of each of the partial spherical lenses is 0.94 p, and
   a center-to-center distance between the two side by side partial spherical lenses is 1.41 p.

5. A lens-attached light-emitting element for structuring a light-emitting element array arranged in one dimension, comprising:
   a light-emitting element having an approximately U-shaped light-emitting area; and
   an approximately U-shaped composite lens including a combination of two partial spherical lenses arranges side by side in a direction of the one dimension and further partial spherical lenses, the composite lens being composed of a base portion having a fixed thickness and curved surface portions each upper surface thereof being curved in a predetermined radius of curvature; wherein
   when the width in a direction of the one dimension of the light-emitting area is p,
   the thickness of the base portion of the composite lens is in the range of 0–0.71 p,
   a radius of curvature of each of the partial spherical lenses is in the range of 0.47 p–1.18 p, and
   a center-to-center distance between the two side by side partial spherical lenses is in the range of 0.23 p–1.17 p.

6. The lens-attached light-emitting element according to claim 5, wherein
   the thickness of the base portion of the composite lenses is 0.59 p,
   a radius of curvature of each of the partial spherical lens is 0.94 p, and
   a center-to-center distance between the two side by side partial spherical lenses is 0.94 p.

* * * * *